United States Patent [19]

Minner

[11] 3,869,623

[45] Mar. 4, 1975

[54] ELECTRONIC SEQUENCE SWITCH WITH HOLDING CIRCUIT

[75] Inventor: Willy Minner, Schwaigern, Germany

[73] Assignee: Licentia Patent-Verwaltungs-G.m.b.H., Frankfurt am Main, Germany

[22] Filed: Apr. 20, 1973

[21] Appl. No.: 353,113

[30] Foreign Application Priority Data

Apr. 29, 1972 Germany .......................... 2221331

[52] U.S. Cl. ................ 307/241, 307/290, 307/254, 307/296

[51] Int. Cl. .......................................... H03k 17/00

[58] Field of Search ........... 307/290, 291, 318, 292, 307/296, 241, 254

[56] References Cited

UNITED STATES PATENTS

| | | | |
|---|---|---|---|
| 3,243,604 | 3/1966 | Johnson | 328/165 |
| 3,268,881 | 8/1966 | Vasel | 307/311 |
| 3,435,257 | 3/1969 | Lawrie, Jr. | 307/318 |
| 3,474,264 | 10/1969 | Hughes | 307/290 |
| 3,529,184 | 9/1970 | Conklin | 307/290 |

*Primary Examiner*—Martin H. Edlow
*Assistant Examiner*—B. P. Davis
*Attorney, Agent, or Firm*—Spencer & Kaye

[57] ABSTRACT

An electronic sequence switch having a holding circuit is prevented from inadvertent release in response to disturbance pulses by a non-linear element which provides a relatively low resistance path for such pulses.

4 Claims, 2 Drawing Figures

ELECTRONIC SEQUENCE SWITCH WITH HOLDING CIRCUIT

BACKGROUND OF THE INVENTION

This invention relates to electronic sequence switches with holding circuits.

Holding circuits are, as is well known, used in electronic switches and have the task of holding the switch, switched by a pulse, in the switching state determined by the direction of the pulse. A positively directed pulse, for example, switches the switch "on" and the holding circuit holds the switch locked in the "on" position even after decay of the pulse. A negatively directed pulse in this example switches the switch "off" and unlocks the holding circuit.

The requirement that, for example, positive pulses on the control line switch on the electronic switch and this is locked by the holding circuit, whereas negative pulses on the control path must not unlock the switch, is demanded of electronic sequence switches, such as are used, for example, in radio and television apparatus for the electronic switch-over of the channels and ranges. By this it is supposed to be ensured that disturbance pulses, for example, caused by switching on electrical apparatus sparkover of the picture tube and so on, do not influence the position of the sequence switch.

To solve this problem it is known to so arrange a transistor in front of the control path for the electronic switch that the latter switches through only positive pulses from the control path (current flow) and blocks negative pulses (current blockage). As a result, however, of unavoidable transistor capacitances and the fact that the control path and the holding circuit itself can intercept disturbance pulses, the disturbance security of previous electronic sequence switches with holding circuits has in many cases not been acceptable.

SUMMARY OF THE INVENTION

The invention is based on the problem of improving the disturbance safety in sequence switches with holding circuits. According to the present invention it is proposed that, in order to increase the disturbance safety of a sequence switch with a holding circuit, a non-linear current/voltage element is connected into the current circuit in such a manner that holding current flows through it and in an operating point it is driven with small differential resistance and that it represents a relatively low electrical resistance for a disturbance pulse. In this way it is ensured that an undesired disturbance signal is conducted away by means of the current/voltage element, so that the sequence switch cannot be switched over.

The non-linear current/voltage element is preferably arranged parallel to the control path, to the input of the sequence switch. A Zener diode, for example, is suitable as the non-linear current/voltage element. In accordance with one form of embodiment an ohmic resistance is connected in front of the Zener diode. This impedance has the task of ensuring the response sensitivity for the desired switching pulses — positive pulses.

BRIEF DESCRIPTION OF THE DRAWINGS

An embodiment of the invention will now be described with reference to the accompanying drawing, in which.

DESCRIPTION OF THE PREFERRED EMBODIMENTS

Figure 1:
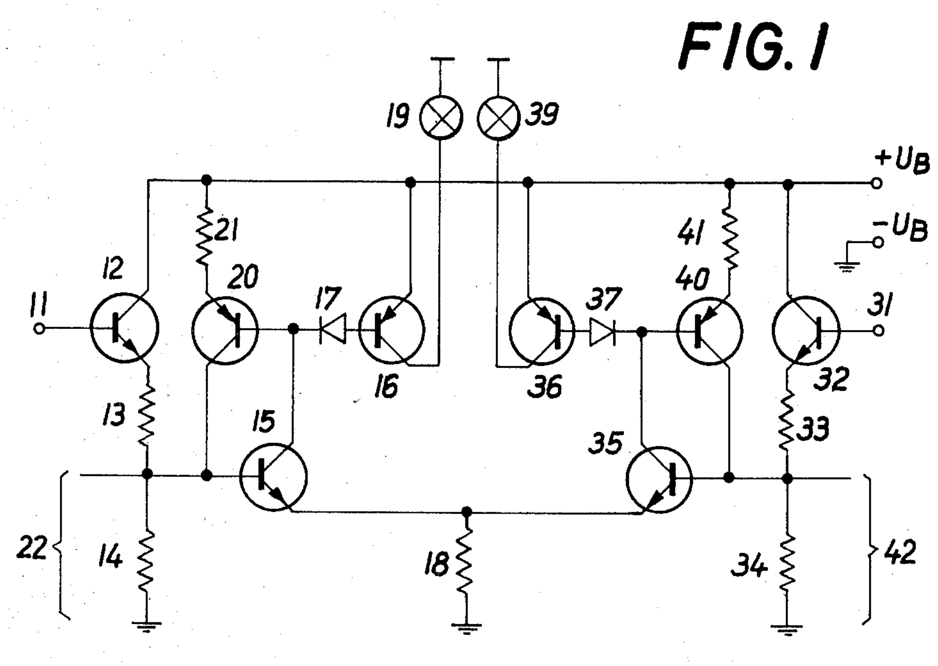
FIG. 1 shows a known sequence switch with holding circuit.

The known sequences switch with holding circuit, shown in FIG. 1, has the task of switching on the lamp 19 when a positive pulse is applied to the input 11 of the entire circuit, and also to keep it switched on after the pulse has decayed. A pulse applied later at the other input 31 is required to re-extinguish the lamp 19 and switch on the lamp 39 and keep it in the switched-on state. According to FIG. 1, for each input a transistor 12 or 32 is connected in front of the sequence switch with the holding circuit, which transistors having the task of allowing a pulse through only in one direction. Thus, in the case of the known circuit of FIG. 1, for example, only a positive pulse is let through. Whereas in FIG. 1 the inputs of the entire circuit, comprising sequence switch and holding circuit with transistors connected in front of them, are given the reference numerals 11 or 31, the actual inputs of the sequence switch are the inputs 22 and 42 which are also called control plant in the following.

The whole circuit of FIG. 1, comprising sequence switch, holding switch and input transistors acting as valves, has the inputs 11 and 31 provided at the base connections of transistors 12 and 32, the collectors of which are connected to the operational voltage $U_B$. A positive pulse at, for example, the input 11, allows a current to flow through the resistances 13 and 14, whereby a voltage is built up across the resistance 14 at the control path 22 forming the input of the sequence switch. This voltage brings the transistor 15 into the conductive state. The current of the transistor 15 flows by means of the emitter-base path of the transistor 16 through the diode 17 and through the resistance 18. The transistor 16 therefore becomes conductive and switches the lamp 19 on. The voltage drop between $+U_B$ and the cathode of the diode 17, namely 2 $\times$ $U_{BE}$ and amounting to approximately 1.2 V in the case of silicon semiconductors, opens the transistor 20. The transistor 20 current, determined by the resistance 21, flows through the resistance 14 and produces at the control path 22 a voltage which keeps the switch switched on, even when the pulse has decayed.

A positive pulse now applied to the input 31 allows a current to flow through the transistor 32 by means of the resistances 33 and 34. If the voltage produced thereby at the control path 42 by the resistance 34 is slightly greater than the voltage at the resistance 18, plus the starting voltage $U_{BE}$ of the transistor 35, then current will flow through this transistor 35 which increases the voltage at the resistance 18 (so that) the current decreases in the transistor 15 and switches off the lamp 19. The current of the transistor 35 flows via the base-emitter path of the transistor 36, the diode 37 and, as already stated, the resistance 18. The transistor 36 becomes conductive and switches the lamp 39 on. The voltage drop between $+U_B$ and the cathode of the diode 37 opens the transistor 40, the current of which, determined by the resistance 41, builds up a voltage at the control path 42 in the above described manner and keeps the sequence switch in the switched-on state.

If a negative disturbance pulse arriving at the input 31 travels to the control path 42 via the base-emitter blockage capacitance of the transistor 32 and the resistance 33 or if, alternatively, the control path itself intercepts a negative disturbance pulse, then, providing that the pulse has sufficient energy, the transistor 35 is blocked and the switch switches "off." The necessary disturbance energy $P_s$ at the control path 42 is $$P_S \approx (U_{34} - U_{BE})^2 / R_{34} \quad (1)$$

wherein $$U_{34} \approx U_{BE} \cdot R_{34} / R_{41}$$

The same applies for the disturbance energy at the control plant 22, if the switch is switched on at the lamp 19.

Figure 2:
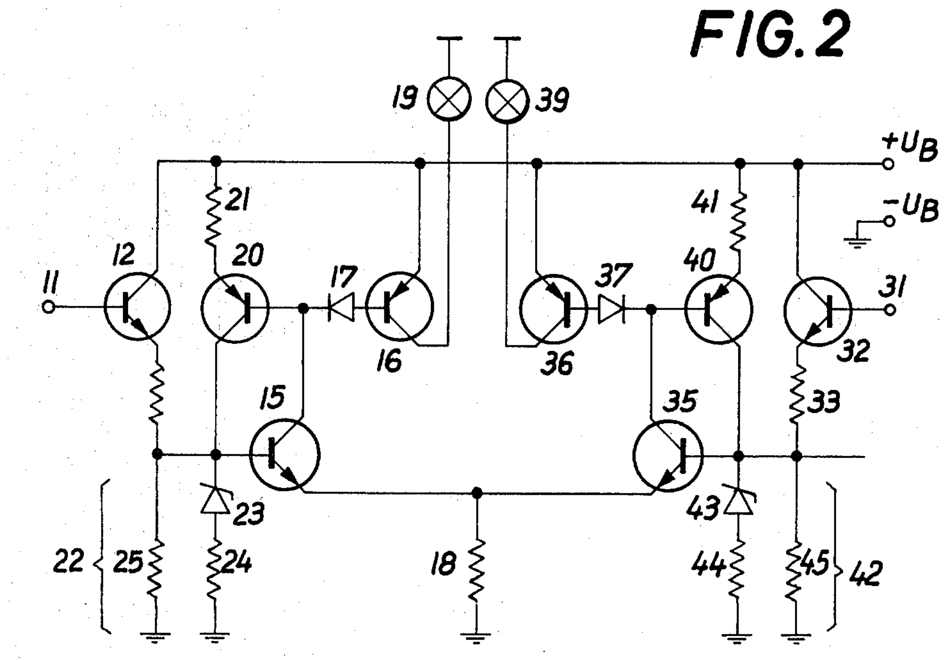
FIG. 2 shows a sequence switch with holding circuit according to the invention.

FIG. 2 shows a circuit embodying the invention, wherein the switch elements which are the same in FIG. 1 have been given the same reference numerals. In accordance with the invention, in FIG. 2 a non-linear current-voltage element is connected in parallel with the control path 22 or 42. This element comprises a Zener diode 23 or 43 in series with a relatively low value resistance 24 or 44, which increases the differential resistance of the Zener diode, and a parallel-connected relatively high value resistance 25 or 45, which reduces the resistance of the Zener diode at voltages which are smaller than the Zener voltage.

For the case that as a result of a positive pulse applied at 31 the sequence switch is switched "on" at the lamp 39 and the holding voltage $U_{34}$ at the base of the transistor 35 is made equal to the voltage $U_{34}$ of FIG. 1 by selection of the Zener diode voltage, the necessary disturbance energy $P'_s$ at the control path 42 to switch "off" amounts to $$P'_S \approx (U_{34} - U_{BE})^2 / R_z + R_{44} \quad (2)$$

wherein $$U_{34} = U_z + U_{BE} \cdot R_z + R_{44} / R_{41}$$

As a result of the introduction, according to the invention, of the Zener diode 43 with the Zener voltage $U_z$ and its differential resistance $R_z$ the resistance $R_z + R_{44}$ can be substantially reduced for the same holding voltage $U_{34}$ in comparison with the resistance $R_{34}$ of FIG. 1. In practice values for $R_z + R_{44}$ result which are smaller than the value for the resistance 34 by the factor 20 and more, so that, from equations (1) and (2), the disturbance energy necessary for switching "off" must likewise increase by the factor 20.

The disturbance safety of the circuit in accordance with the invention is thus substantially improved as compared with conventional circuits.

It should be mentioned that the necessary energy for the positive "on" switch pulse does not increase by the above mentioned factor 20 as a result of the circuit in accordance with the invention, because the resistance 45 or 25 can be selected to be of substantially higher impedance than the corresponding resistance 34 or 14, so that only a voltage of a few tenths of a volt need be produced at the resistance 44 or 25 by the positive control pulse. In practice the same switch-on sensitivity as compared with the circuit according to FIG. 1 is achieved with a 1.5 to 2-times energy for the positive "on" switch pulse.

It will be understood that the above description of the present invention is susceptible to various modification changes and adaptations.

What is claimed is:

1. In a sequence switch circuit composed of a plurality of sequence switch members each including a signal input, a switching unit switchable between a switched-on state and a switched-off state, and a holding circuit connected to said unit, said input, unit and holding circuit of each said member being connected for causing a signal at said input of one said member to switch said switching unit of said one member to its switched-on state and to initiate flow of a holding current in said holding circuit of said one member to hold said associated unit in its switched-on state, and for causing such holding current to continue to flow until a signal is applied to said input of another one of said members to cause: said switching unit of said one member to be switched to its switched-off state; said switching unit of said other member to be switched to its switched-on state; and a holding current to flow in said holding circuit of said other member, the improvement comprising: a non-linear current/voltage element connected to said holding circuit in such a manner that holding current flows through said element and maintains said element at an operating point such that it is driven with small differential resistance and that it represents a relatively low electrical resistance for a disturbance pulse.

2. An electronic sequence switch circuit according to claim 1, wherein the non-linear current-voltage element is arranged parallel to the control path, the input of the sequence switch.

3. An electronic sequence switch circuit according to claim 1, wherein a Zener diode is provided as the non-linear current/voltage element.

4. An electronic sequence switch circuit according to claim 3, wherein an impedance is connected in front of the Zener diode.

* * * * *